Oct. 15, 1968 J. SPITERI 3,406,403

VARIABLE FREQUENCY OSCILLATOR

Filed Nov. 27, 1964

INVENTOR.
JOSEPH SPITERI
BY Charles L. Lovercheck
attorney

United States Patent Office 3,406,403

Patented Oct. 15, 1968

3,406,403
VARIABLE FREQUENCY OSCILLATOR

Joseph Spiteri, 142 W. 26th St., Erie, Pa. 16508

Filed Nov. 27, 1964, Ser. No. 414,224
1 Claim. (Cl. 343—225)

ABSTRACT OF THE DISCLOSURE

The invention disclosed herein is made up of a transmitter containing an oscillator which has its frequency controlled by a cardlike ticket. The frequency of the oscillator may be changed to other frequencies by cardlike tickets. The oscillator is used in combination with two or more receivers that are likewise tuned by means of the cardlike tickets containing a condenser. This makes it possible to immediately and precisely tune the transmitter to the particular receiver desired and vice-versa. This invention has particular utility in the improvements listed below.

This invention relates to oscillators and, more particularly, to an oscillator which may be used in combination with a ticket or token to selectively operate a plurality of devices on predetermined frequencies.

The oscillator disclosed herein is referred to for convenience as a memory ticket oscillator. The oscillator disclosed herein utilizes a ticket which has two capacitors and in some cases three capacitors, built into it. Terminals are provided on the oscillator and mating terminals on the ticket so that one of the capacitors is connected in the grid circuit and the other capacitor is connected in the plate circuit when the ticket is inserted in the oscillator. Thus, the capacitance of the two capacitors will balance the reactance of the plate circuit and the grid circuit so that the plate and grid tank circuits are in resonance. By properly selecting the capacitance values, the oscillator may be operated at maximum efficiency and at different frequencies. This particular ticket controlled oscillator is especially useful in radio controls for operating various devices where a plurality of tickets may be provided and each ticket tapes the oscillator to a different frequency to a separate receiver. These receivers could be used to operate selectively a plurality of doors, to position a rotating parking lot, or a great many other applications.

It is, accordingly, an object of the present invention to provide an improved oscillator.

Another object of the invention is to provide an oscillator which will operate at a plurality of predetermined frequencies at maximum output.

Another object of the invention is to provide an oscillator whose frequency may be varied at maximum output by inserting tickets containing electrical components into the circuit.

With the above and other objects in view, the present invention consists of the combination and arrangement of parts hereinafter more fully described illustrated in the accompanying drawing and more particularly pointed out in the appended claim, it being understood that changes may be made in the form, size, proportions, and minor details of construction without departing from the spirit or sacrificing any of the advantages of the invention.

Figure 1:
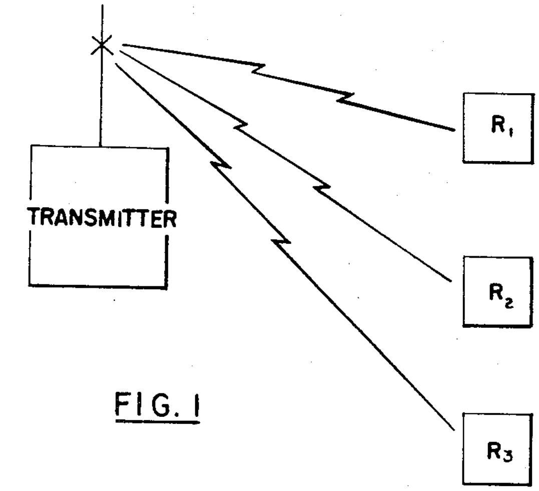
FIG. 1 is a schematic view of an improved oscillator represented as embodied in a transmitter for use to operate selectively a plurality of receivers.
Figures 2, 3, 4, 5, 6:
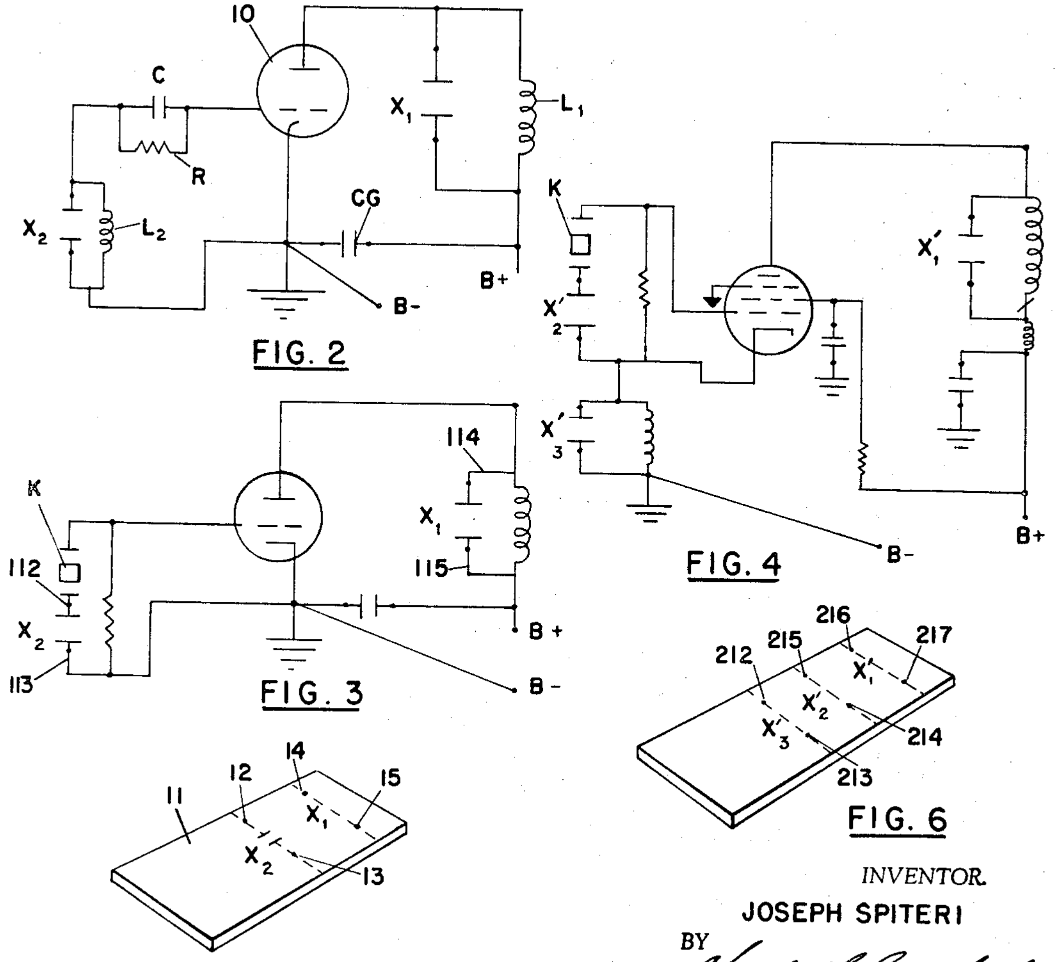
FIG. 2 is a schematic wiring diagram of an oscillator according to the invention.
FIG. 3 is another embodiment of the invention.
FIG. 4 is yet another embodiment of the invention.
FIG. 5 is a schematic view of a ticket for use in the oscillator.
FIG. 6 is another embodiment of a ticket suitable for use in the circuit shown in FIG. 4.

Now with more particular reference to the drawing, any of the oscillators shown in FIGS. 2, 3 and 4 could be incorporated in a transmitter such as indicated in FIG. 1 and used to actuate receivers as indicated. It is well known in the electronic arts that any amplifier circuit which is arranged to supply its own input voltage in the proper magnitude and phase will generate oscillation. Many circuits can be used for this purpose and those shown in the present application are shown by way of example only. In general, the voltage fed back from the output and applied to the grid of the tube must be approximately 180° out of phase with the voltage existing across the load impedance in the plate circuit of the amplifier and must have a magnitude sufficient to produce the output power necessary to develop the input voltage.

The frequency at which the oscillations occur is the frequency at which the voltage fed back from plate circuit to grid circuit is exactly the proper phase and magnitude to enable the tube to supply its own input. The oscillator is associated in some way with a resonant circuit as are those shown in the examples herein. The frequency of oscillation approximates very closely the resonant frequency of this circuit and since the ticket provides a separate grid resistor and a separate plate resistor for each frequency, the oscillator will be tuned to optimum performance for each frequency selected for a particular fixed frequency.

Now with more specific reference to the drawing and, particularly, FIG. 2, a tube 10 is shown in FIG. 2 which is of the triode variety having a conventional plate, cathode, and grid. The grid circuit is provided with the conventional tank circuit made up of the inductance $L_2$ and the capacitance $X_2$ connected in parallel with each other and connected in series with the grid and cathode. The capacitance $X_2$ as well as the capacitance $X_1$ in the tank circuit of the plate are built into the ticket shown at 11 in FIG. 5.

The plate tank circuit is made up of the inductance $L_1$, capacitance $X_1$ which are connected in parallel with each other and in series with the plate and the B+ voltage through condenser CG. Conventional resistance capacitance circuits R-C are connected in the grid. The B— is, at ground potential.

It will be noted that in practice, the ticket 11 may be made up of commercial capacitors molded in plastic or other suitable material. The capacitors could be in the form of metallic strips or in combination with paper, tinfoil paper, or the like. The terminals for the capacitance $X_1$ and $X_2$ are indicated at 12, 13, 14, and 15 and these terminals may be inserted in any suitable jack or the like.

In the embodiment of the oscillator shown in FIG. 3, a crystal controlled oscillator is shown which functions exactly like the oscillator shown in FIG. 2 with one exception; that is, the primary function of the crystal is to keep the oscillator on a particular frequency. If, however, a capacitor is inserted in series with the crystal, the frequency of the oscillator will be increased. Therefore, by inserting the capacitance of the capacitor in the memory ticket shown in FIG. 5 connected between the terminals 112 and 113 and the terminals 114 and 115, the frequency of the oscillator will be changed to a higher frequency, depending upon the value of the capacitors $X_1$ and $X_2$.

In the embodiment of the invention shown in FIG. 4, a modified tri-tet crystal oscillator capable of delivering sufficient power on all bands to drive an 807 or a 6146 type of tube or the like is shown. This oscillator can be used by itself as a complete transmitter. In this particular oscillator, three circuits would be adjusted simultaneously. For example, the oscillator with the $X_2'$ capacitor would be seven megacycles and the circuit with the $X_3'$ tank circuit would be one and one-half times the crystal frequency or ten and one-half megacycles. The $X_1'$ capacitor on the plate tank circuit would be three times the $X_2'$ frequency or twenty-one megacycles. The ticket shown in FIG. 6 would be provided with suitable terminals 212, 213, 214, 215, 216, and 217 to be inserted between the corresponding terminals in the circuit shown in FIG. 4.

It will be seen that by making the capacitors in the tickets the proper selected values of capacitance, the circuits in FIGS. 2, 3, and 4 can all be made to operate at optimum efficiency for a plurality of predetermined frequencies.

The foregoing specification sets forth the invention in its preferred practical forms but it is understood that the structure shown is capable of modification within a range of equivalents without departing from the invention which is to be understood is broadly novel as is commensurate with the appended claim.

The embodiments of the invention in which an exclusive property or privilege is claimed are defined as follows:

1. In combination, a transmitter and a plurality of receivers each tuned to a different frequency, said transmitter having an oscillator therein, said oscillator having a grid tank circuit, including a crystal and a first condenser, a plate tank circuit including an inductor and a second condenser, and a third tank circuit in series with said grid tank circuit, including an inductor and a third condenser, means for tuning said transmitter selectively to one of said frequencies comprising, a plurality of tickets, each said ticket having said first, second, and third condensers therein in a particular combination of values unique to each receiver, and means to connect each said ticket selectively to said transmitter whereby said first condenser is connected to said grid tank circuit and said second condenser is connected to said plate tank circuit and said third condenser is connected to said third tank circuit, whereby said transmitter is tuned to a particular one of said receivers when a particular said ticket is connected thereto.

References Cited

UNITED STATES PATENTS

| | | | |
|---|---|---|---|
| 2,671,165 | 3/1954 | Gilpen et al. | 340—171 |
| 2,774,060 | 12/1956 | Thompson | 331—65 |
| 2,779,874 | 1/1957 | Sonbergh | 317—146 |
| 2,921,152 | 1/1960 | Simjian | 200—42 |
| 3,041,550 | 6/1962 | Goncharoff | 331—164 |

JOHN W. CALDWELL, *Primary Examiner.*

A. KASPER, *Assistant Examiner.*